(12) United States Patent
Bae et al.

(10) Patent No.: US 8,618,637 B2
(45) Date of Patent: Dec. 31, 2013

(54) SEMICONDUCTOR PACKAGE USING THROUGH-ELECTRODES HAVING VOIDS

(75) Inventors: Han Jun Bae, Gyeonggi-do (KR); Woong Sun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 894 days.

(21) Appl. No.: 12/192,173

(22) Filed: Aug. 15, 2008

(65) Prior Publication Data
US 2009/0321892 A1    Dec. 31, 2009

(30) Foreign Application Priority Data
Jun. 30, 2008  (KR) .................. 10-2008-0062910

(51) Int. Cl.
*H01L 23/488*  (2006.01)
(52) U.S. Cl.
USPC .... 257/621; 257/686; 257/777; 257/E23.123; 257/E23.168; 257/E23.169
(58) Field of Classification Search
USPC .......... 257/621, 686, 777, E23.123, E23.168, 257/E23.169
See application file for complete search history.

(56) References Cited

U.S. PATENT DOCUMENTS

| | | | | |
|---|---|---|---|---|
| 6,566,232 B1 * | 5/2003 | Hara et al. | ..................... | 438/455 |
| 6,577,013 B1 * | 6/2003 | Glenn et al. | ................... | 257/777 |
| 7,112,525 B1 | 9/2006 | Bhansali et al. | | |
| 7,135,773 B2 * | 11/2006 | Furukawa et al. | ............ | 257/758 |
| 2003/0179559 A1 * | 9/2003 | Engelhardt et al. | ........... | 361/780 |
| 2003/0211724 A1 * | 11/2003 | Haase | .......................... | 438/629 |
| 2004/0079163 A1 * | 4/2004 | Clerc et al. | ...................... | 73/774 |
| 2004/0152240 A1 * | 8/2004 | Dangelo | ....................... | 438/122 |
| 2006/0119374 A1 * | 6/2006 | Maruyama et al. | ........... | 324/754 |
| 2007/0001266 A1 * | 1/2007 | Arana et al. | ................... | 257/621 |
| 2007/0222050 A1 * | 9/2007 | Lee et al. | ...................... | 257/678 |
| 2008/0081386 A1 * | 4/2008 | Raravikar et al. | ............... | 438/15 |
| 2008/0142969 A1 | 6/2008 | Hakuno | | |
| 2008/0242079 A1 * | 10/2008 | Xu et al. | ....................... | 438/650 |
| 2009/0014843 A1 * | 1/2009 | Kawashita et al. | ........... | 257/621 |
| 2009/0267194 A1 * | 10/2009 | Chen | ............................ | 257/621 |

FOREIGN PATENT DOCUMENTS

| | | |
|---|---|---|
| JP | 2000-332164 A | 11/2000 |
| JP | 2003-142632 A | 5/2003 |
| KR | 1020020059175 A | 7/2002 |

OTHER PUBLICATIONS

Xu et al., Aligned Carbon Nanotube for Through-Wafer Interconnects, Applied Physics Letters, No. 91, Jul. 2007, pp. 042108-1 to 042108-3.*
English Machine Translation of JP 2001-068618, H. Nobuaki, obtained online on May 5, 2013.*

* cited by examiner

*Primary Examiner* — Peniel M Gumedzoe
(74) *Attorney, Agent, or Firm* — Ladas & Parry LLP

(57) ABSTRACT

A semiconductor package includes a semiconductor chip having a plurality of bonding pads. Through-electrodes are formed in the semiconductor chip and are electrically connected to the bonding pads. The through electrodes comprise a plurality of conductors and a plurality of voids that are defined by the conductors. Each conductor may include a plurality of nanowires grouped into a spherical shape having a plurality of voids, a plurality of nanowires grouped into a polygonal shape having a plurality of voids, or the conductors may include a plurality of micro solder balls. The voids of the through electrode absorb stress caused when head is generated during the driving of the semiconductor package.

16 Claims, 3 Drawing Sheets

SEMICONDUCTOR PACKAGE USING THROUGH-ELECTRODES HAVING VOIDS

CROSS-REFERENCE TO RELATED APPLICATIONS

The present application claims priority to Korean patent application number 10-2008-0062910 filed on Jun. 30, 2008, which is incorporated herein by reference in its entirety.

BACKGROUND OF THE INVENTION

The present invention relates generally to a semiconductor package, and more particularly, to a semiconductor package which uses through-electrodes in such a way as to improve the reliability of an electrical connection within the package.

The semiconductor industry has progressed towards lightweight, high-speed, multi-functional semiconductor products with improved reliability that can be manufactured at a reduced cost. Semiconductor packaging technology is regarded as an important technique for achieving the goals of the semiconductor industry.

Semiconductor packaging technology protects a semiconductor chip (which is formed with a circuit section through a wafer assembly process) from external circumstances; and also, semiconductor packaging technology can be used to easily mount a semiconductor chip to a substrate, thereby securing the operational reliability of the semiconductor chip. Semiconductor packaging technology includes a semiconductor chip attaching process, a wire bonding process, a molding process, and a trimming and forming process. These semiconductor packaging processes can be conducted at the chip level or the wafer level.

Recent efforts in semiconductor packaging technology have been undertaken to develop technologies in which at least two semiconductor chips or semiconductor packages are stacked in order to obtain high capacity of the semiconductor package and to improve mounting efficiency while increasing miniaturization. Through the use of stack packages, a product having greater memory capacity than that attainable using a semiconductor integration process, and a product having higher mounting area utilization efficiency can be obtained.

In stack packages, a semiconductor chip or semiconductor package is electrically connected to a substrate and semiconductor chips or semiconductor packages are electrically connected to each other using metal wires, bumps, or through-electrodes. Using through-electrodes in a stack package to form electrical connections, minimizes the occurrence of electrical degradation. Also, a stack package using through-electrodes for electrical connection can achieve increased operational speed and miniaturization is enabled. The just described benefits are one reason for the recent increase in popularity of stack packages.

The through-electrodes of the stack package are formed by defining via holes in a semiconductor chip and using a plating process to fill the via holes with a metallic material. The through-electrodes may also be formed using a soldering process.

At this time, the through-electrodes (which are formed by the plating or soldering process) and the semiconductor chip have different thermal expansion coefficients. Thus, thermal changes in the semiconductor package are likely to induce cracking in the semiconductor package due to the stress caused by the difference between the respective thermal expansion coefficients, thereby decreasing the semiconductor package's reliability.

When the through-electrodes are formed by defining via holes after a plurality of semiconductor chips or wafers have been stacked, it is difficult to properly form the through-electrodes due to the substantial aspect ratio of the via holes. In other words, when the through-electrodes are formed by the plating process, the substantial aspect ratio of the via holes causes the metallic material forming the through-electrodes to fill in only the upper portions of the via holes. As a consequence, electrical signal connection in the semiconductor package using the through-electrodes becomes impossible. Mechanical experiments show that vapor enters and fills the lower portions of the via holes, resulting in the breakdown of the semiconductor package.

SUMMARY OF THE INVENTION

Embodiments of the present invention are directed to a semiconductor package which uses through-electrodes in a manner that improves the reliability of an electrical connection within the package.

In one aspect of the present invention, a semiconductor package comprises a semiconductor chip having a plurality of bonding pads; and through-electrodes formed in the semiconductor chip so as to be electrically connected with the respective bonding pads and composed of conductors and voids defined by the conductors.

Each of the conductors comprises nanowires.

Each of the conductors comprises a plurality of nanowire groups which are massed in nanowires, exist as a spherical shape and have a plurality of voids defined by nanowires.

Each of the conductors has a diameter of 1~40 μm.

Each of the conductors comprises a plurality of nanowires which are grouped into a polygonal shape while having voids.

The conductors comprise micro solder balls.

Each of the micro solder balls has a diameter of 1~40 μm.

In another aspect of the present invention, a semiconductor package comprises a substrate having a plurality of connection pads; a semiconductor chip attached to the substrate and having bonding pads; and a plurality of through-electrodes in the semiconductor chip electrically connecting the bonding pads of the semiconductor chip with the corresponding connection pads of the substrate, each composed of conductors and voids defined by the conductors.

Each of the conductors comprises nanowires.

Each of the conductors comprises a plurality of nanowire groups which are massed in nanowires, exist as a spherical shape and have a plurality of voids defined by nanowires.

Each of the conductors has a diameter of 1~40 μm.

Each of the conductors comprises a plurality of nanowires which are grouped into a polygonal shape while having voids.

The conductors comprise micro solder balls.

Each of the micro solder balls has a diameter of 1~40 μm.

The semiconductor package further comprises a capping layer formed on the ends of the through-electrodes facing away from the connection pads of the substrate.

In still another aspect of the present invention, a semiconductor package comprises a substrate having a plurality of connection pads; and at least two package units stacked on the substrate, wherein each package unit includes a semiconductor chip having bonding pads and a plurality of through-electrodes formed in the semiconductor chip in such a way as to electrically connect the bonding pads of the semiconductor chip, the corresponding connection pads of the substrate and the package units to one another and each composed of conductors and voids defined by the conductors.

Each of the conductors comprises nanowires.

Each of the conductors comprises a plurality of nanowire groups which are massed in nanowires, exist as a spherical shape and have a plurality of voids defined by nanowires.

Each of the conductors has a diameter of 1~40 μm.

Each of the conductors comprises a plurality of nanowires which are grouped into a polygonal shape while having voids.

The conductors comprise micro solder balls.

Each of the micro solder balls has a diameter of 1~40 μm.

The semiconductor package further comprises a capping layer formed on the through-electrodes of the uppermost semiconductor chip.

DESCRIPTION OF SPECIFIC EMBODIMENTS

Hereafter, specific embodiments of the present invention will be described in detail with reference to the attached drawings.

Figure 1:
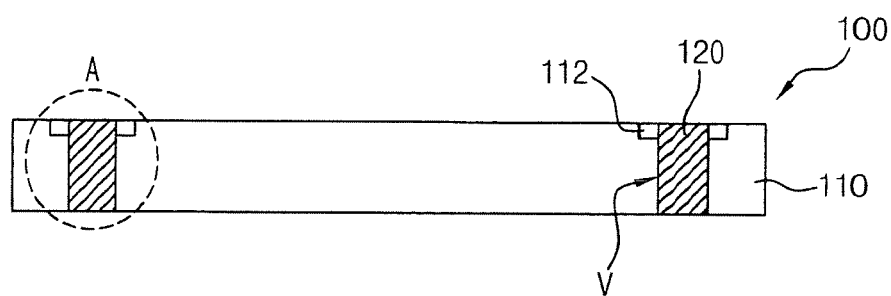
FIG. 1 is a cross-sectional view showing a semiconductor package in accordance with a first embodiment of the present invention.
Figure 2:
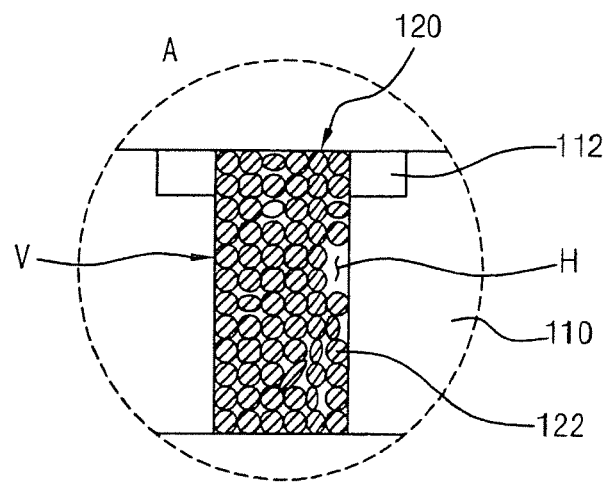
FIG. 2 is an enlarged view showing part 'A' of FIG. 1.

FIG. 1 is a cross-sectional view showing a semiconductor package in accordance with a first embodiment of the present invention, and FIG. 2 is an enlarged view showing part 'A' of FIG. 1.

Referring to FIG. 1, a semiconductor package 100 according to the present embodiment includes a semiconductor chip 110 having a plurality of bonding pads 112 formed on the upper surface thereof and through-electrodes 120 each filled in one of a plurality of via holes V with each via hole V being defined in and extending through the semiconductor chip 110.

As shown in FIG. 2, the through-electrodes 120 are formed in a manner such that conductors 122 are filled in the via holes V. The through-electrodes 120 are electrically connected to the bonding pads 112 of the semiconductor chip 110. In more detail, each of the through-electrodes 120 includes a plurality of conductors 122 filled in the via hole V. The conductors 122 may have various shapes and voids H may be defined by the conductors 122.

Figure 3:
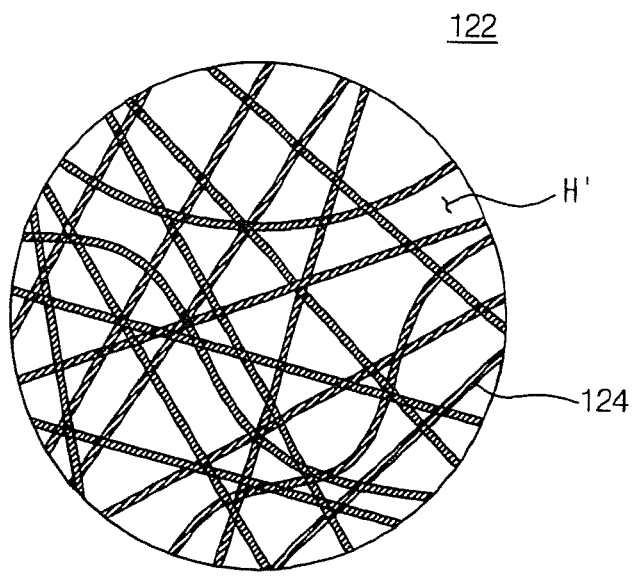
FIG. 3 is a view showing nanowires constituting a conductor according to the present invention.

The conductors 122 comprise micro-sized micro solder balls each having a diameter in the range of 1~40 μm or a plurality of nanowires 124, which are grouped as shown in FIG. 3 and which have a nano-size diameter. When the conductors 122 comprising the nanowires 124 are formed such that the plurality of nanowires 124 are grouped with one another, the conductors 122 have nano-sized nanovoids H'. Each of the conductors 122 formed by the grouped nanowires 124 has a spherical shape with a diameter of in the range of 1~40 μm or a polygonal shape. The through-electrodes 120 are formed by the conductors 122 comprising the nanowires 124 in a manner such that groups, in each of which the plurality of nanowires 124 formed from the outside are grouped with one another, are filled in the via holes V.

The through-electrodes 120 can be formed in a manner such that nanowires 124, which include nanovoids H' and which do not define a fixed shape, are filled in the via holes V in place of the conductors 122. At this time, the through-electrodes 120 are formed by introducing liquid or vapor nanowire forming material in the via holes V, and then conducting a post-process to grow the nanowires 124.

In order to ensure a stable electrical connection between the conductors 122 formed in the via-holes V and the inner surfaces of the bonding pads 112 facing the via holes V, a conductive adhesive (not shown) can be applied to the inner surfaces of the bonding pads 112.

Figure 4:
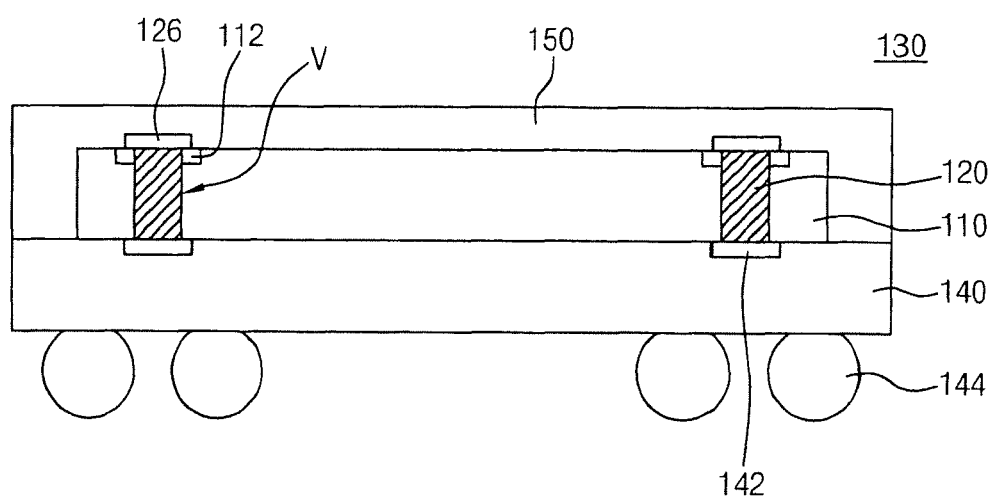
FIG. 4 is a cross-sectional view showing a semiconductor package in accordance with a second embodiment of the present invention.

FIG. 4 is a cross-sectional view showing a semiconductor package in accordance with a second embodiment of the present invention.

Referring to FIG. 4, a semiconductor chip 110, which includes through-electrodes 120 filled in via holes V, is placed on a substrate 140, and is then formed as a semiconductor package 130 which can be mounted to an outside circuit. In other words, the semiconductor package 130 according to the present embodiment includes the substrate 140, the semiconductor chip 110 attached to the substrate 140, and the through-electrodes 120 formed in the semiconductor chip 110.

In detail, the substrate 140 has a plurality of connection pads 142 on the upper surface thereof, and electrode terminals (not shown) are located on the lower surface of the substrate 140 to be electrically connected to an outside circuit. The semiconductor chip 110 is attached to the substrate 140 by an adhesive (not shown) at a position where the respective through-electrodes 120 correspond to the connection pads 142.

The semiconductor chip 110 has a plurality of bonding pads 112. The through-electrodes 120 are formed in the semiconductor chip 110 such that the bonding pads 112 of the semiconductor chip 110 and the corresponding connection pads 142 of the substrate 140 are electrically connected to each other. As shown in FIG. 2, the through-electrode 120 has conductors 122 and voids H defined by the conductors 122.

A capping layer 126 is formed on the upper surface of the semiconductor chip 110 including the through-electrodes 120 facing away from the connection pads 142 of the substrate 140 in order to prevent the conductors 122 constituting the through-electrodes 120 from being released from the via holes V.

An encapsulant 150 is formed to cover the semiconductor chip 110 which is placed on the substrate 140. Outside connection terminals 144 (such as solder balls) are attached to the electrode terminals (not shown) formed on the lower surface of the substrate 140.

The semiconductor package 130 is formed as described below. The semiconductor chip 110 having the via holes V is attached to the substrate 140, and then through-electrodes 120 having voids H are formed by filling the via holes V with the conductors 122. The connection pads 142 of the substrate 140 and the bonding pads 112 of the semiconductor chip 110 are electrically connected to each other by the through-electrodes 120.

The capping layer 126 is then formed on the semiconductor chip 110 so that the conductors 122 constituting the through-electrodes 120 are prevented from being released out of the via holes V. At this time, formation of the capping layer 126 is not required if there is no possibility of the conductors 122 releasing during processing of the semiconductor package 130.

Next, formation of the encapsulant 150 on the substrate 140 by attaching the outside connection terminals 144 on the lower surface of the substrate 140 completes manufacture of the semiconductor package 130 according to the present embodiment of the present invention.

Figure 5:
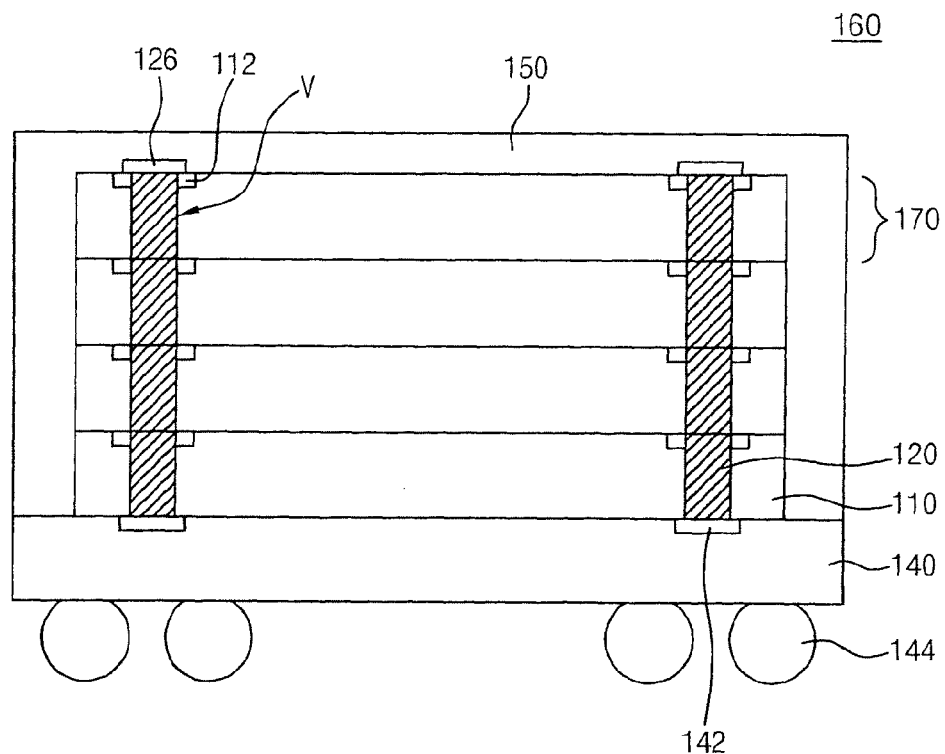
FIG. 5 is a cross-sectional view showing a semiconductor package in accordance with a third embodiment of the present invention.

FIG. 5 is a cross-sectional view showing a semiconductor package in accordance with a third embodiment of the present invention.

Referring to FIG. 5, a stack package is realized by stacking a plurality of semiconductor chips, each having through-electrodes composed of conductors and voids defined by the conductors, upon one another.

In detail, in the present embodiment, a semiconductor package 160 having a stack structure is formed such that at least two package units 170 are stacked using an adhesive (not shown) on a substrate 140 having a plurality of connection pads 142 on the upper surface thereof and electrode terminals (not shown) on the lower surface thereof.

Each package unit 170 includes a semiconductor chip 110 having bonding pads 112 and a plurality of through-electrodes 120. The through-electrodes 120 function to electrically connect the bonding pads 112 of semiconductor chips 110, the connection pads 142 of the substrate 140, and the package units 170 to one another. As shown in FIG. 2, the through-electrode 120 has conductors 122 and voids H defined by the conductors 122.

A capping layer 126 is formed on the through-electrodes 120 of the uppermost package unit 170, that is, the uppermost semiconductor chip 110, so as to prevent release of the conductors 122 constituting the through-electrodes 120 out of via holes V.

An encapsulant 150 is formed on the substrate 140 to cover the semiconductor chips 110, and outside connection terminals 144 (such as solder balls) are attached to the electrode terminals (not shown) formed on the lower surface of the substrate 140.

Figure 6:
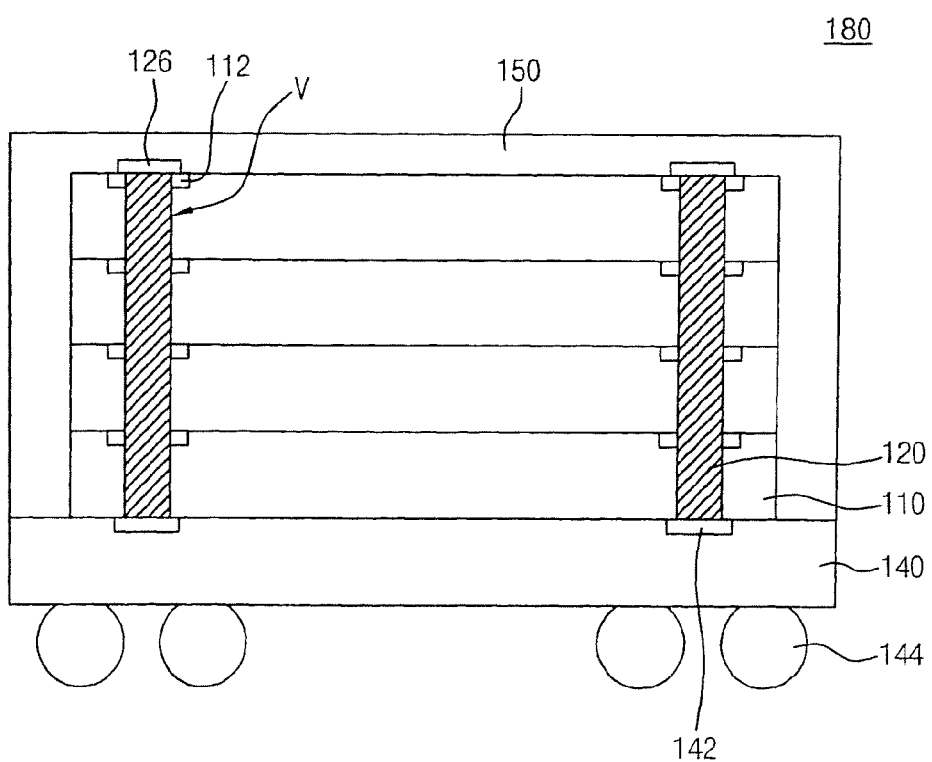
FIG. 6 is a cross-sectional view showing a semiconductor package in accordance with a fourth embodiment of the present invention.

FIG. 6 is a cross-sectional view showing a semiconductor package in accordance with a fourth embodiment of the present invention.

Referring to FIG. 6, a semiconductor package 180 having a stack structure according to the present embodiment has a configuration in which a plurality of through-electrodes 120 are simultaneously formed through a plurality of stacked semiconductor chips 110.

The semiconductor package 180 according to the present embodiment is formed as described below.

First, a plurality of semiconductor chips 110 is stacked on a substrate 140, and via holes V are then defined in and through the stacked semiconductor chips 110 such that the connection pads 142 of the substrate 140 are exposed.

Through-electrodes 120 having voids H are formed by filling conductors 122 in the via holes V, and a capping layer 126 is then formed on the uppermost semiconductor chip 110 such that the conductors 122 constituting the through-electrodes 120 are prevented from being released out of the via holes V.

Next, an encapsulant 150 and outside connection terminals 144 are formed on the substrate 140, and by conducting a series of well-known subsequent processes the manufacturing process of the semiconductor package 180 according to the present embodiment is completed.

The various semiconductor packages according to the embodiments of the present invention can be manufactured at the wafer level or the chip level.

As is apparent from the above description, the semiconductor package according to the present invention is formed using through-electrodes that are formed by filling conductors in via holes. Therefore, even when the aspect ratio of the via holes in which the through-electrodes are formed is substantial, the through-electrodes can be easily formed in such a way so as to improve the reliability of electrical connection.

Further, the through-electrodes of the semiconductor package according to the present invention are formed by filling conductors comprising grouped nanowires having nanovoids or conductors comprising micro solder balls into the via holes such that voids are defined by the conductors. Accordingly, the voids including the nanovoids function to absorb the stress induced by the difference in thermal expansion coefficients between the component elements of the semiconductor package, which is caused by the heat generated during driving of the semiconductor package. Therefore, it is possible to prevent cracks from occurring in a semiconductor chip which are caused by the stress induced by the differences in thermal expansion coefficients between the silicon constituting the semiconductor chip and the metallic material constituting the through-electrodes during driving of the conventional semiconductor package having through-electrodes formed by a plating or soldering process. As a result, the reliability of the electrical connection in the semiconductor package according to an embodiment of the present invention is improved.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor package comprising:
a semiconductor chip having a bonding pad;
a through-electrode formed by filing a plurality of conductors in a via hole which is formed in the semiconductor chip so as to have a plurality of voids, said through-electrode being electrically connected to the bonding pad, wherein each conductor of the plurality of conductors is formed by grouping nanowires into a spherical shape or a polygonal shape; and
a conductive adhesive applied to an inner surface of the bonding pad facing the through-electrode.

2. A semiconductor package comprising:
a semiconductor chip having a bonding pad;
a through-electrode formed by filing a plurality of conductors in a via hole which is formed in the semiconductor chip so as to have a plurality of voids, said through-electrode being and electrically connected to the bonding pad, the through-electrode comprises the plurality of conductors and one or more voids defined by the conductors,
wherein each conductor of the plurality of conductors comprises a plurality of nanowires grouped together so as to form a spherical or a polygonal shape, each of the plurality of conductors having a plurality of voids defined by nanowires, wherein the plurality of conductors each comprising the plurality of nanowires are stacked on one another so as to fill the through-electrode.

3. The semiconductor package according to claim 2, wherein each of the conductors has a diameter in the range of 1~40 µm.

4. A semiconductor package comprising:
a semiconductor chip having a bonding pad;
a through-electrode formed in the semiconductor chip and electrically connected to the bonding pad, wherein the through-electrode comprises a plurality of conductors and one or more voids defined by the conductors,
wherein the conductors comprise homogenous micro solder balls.

5. The semiconductor package according to claim 4, wherein each of the micro solder balls has a diameter in the range of 1~40 μm.

6. A semiconductor package comprising:
a substrate having a plurality of connection pads;
a semiconductor chip attached to the substrate and having a plurality of bonding pads;
a plurality of through-electrodes, formed by filing a plurality of conductors in a via hole which is formed in the semiconductor chip so as to have a plurality of voids, to electrically connect to the bonding pads of the semiconductor chip to the connection pads of the substrate, wherein each conductor of the plurality of conductors is formed by grouping nanowires into a spherical shape or a polygonal shape;
a capping layer formed on each bonding pad and the end of each through-electrode facing away from the connection pads of the substrate to prevent the plurality of conductors from being released.

7. The semiconductor package according to claim 6, wherein one or more of the conductors comprises a plurality of nanowires groups which are massed in nanowires, exist as a spherical shape and have a plurality of voids defined by the nanowires.

8. The semiconductor package according to claim 7, wherein each of the conductors has a diameter in the range of 1~40 μm.

9. The semiconductor package according to claim 6, wherein one or more of the conductors comprises a plurality of nanowires grouped into a polygonal shape having a plurality of voids.

10. The semiconductor package according to claim 6, wherein the conductors comprise micro solder balls.

11. The semiconductor package according to claim 10, wherein each of the micro solder balls has a diameter in the range of 1~40 μm.

12. A semiconductor package comprising:
a substrate having a plurality of connection pads; and
at least two package units stacked on the substrate,
wherein each package unit comprises:
a semiconductor chip having a plurality of bonding pads and via holes,
wherein the via holes of the semiconductor chips of the at least two package unit are aligned, and a single through-electrodes, formed by filing a plurality of conductors in a via hole which is formed in the semiconductor chip so as to have a plurality of voids, passes through each of the aligned via holes to electrically connect the bonding pads of the semiconductor chip, the corresponding connection pads of the substrate, and the package unit to one another, wherein each conductor of the plurality of conductors is formed by grouping nanowires into a spherical shape or a polygonal shape.

13. The semiconductor package according to claim 12, wherein one or more of the conductors comprises a plurality of nanowires groups which are massed in nanowires, exist as a spherical shape and have a plurality of voids defined by the nanowires.

14. The semiconductor package according to claim 13, wherein each of the conductors has a diameter in the range of 1~40 μm.

15. The semiconductor package according to claim 12, wherein one or more of the conductors comprises a plurality of nanowires grouped into a polygonal shape having a plurality of voids.

16. The semiconductor package according to claim 12, further comprising:
a capping layer formed on the through-electrodes of the uppermost semiconductor chip.

* * * * *